US008481937B2

(12) United States Patent
Matsumoto

(10) Patent No.: US 8,481,937 B2

(45) Date of Patent: Jul. 9, 2013

(54) PHOTOCATHODE APPARATUS USING PHOTOELECTRIC EFFECT OF SURFACE PLASMON RESONANCE PHOTONS

(75) Inventor: Takahiro Matsumoto, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 1027 days.

(21) Appl. No.: 12/465,734

(22) Filed: May 14, 2009

(65) Prior Publication Data

US 2009/0284150 A1 Nov. 19, 2009

(30) Foreign Application Priority Data

May 15, 2008 (JP) ................................ 2008-127943

(51) Int. Cl.
*H01L 25/00* (2006.01)

(52) U.S. Cl.
USPC ........................................................ 250/332

(58) Field of Classification Search
USPC ........................................................ 250/332
See application file for complete search history.

(56) References Cited

U.S. PATENT DOCUMENTS 4,451,123 A * 5/1984 McNeill et al. ............... 359/263
5,049,462 A * 9/1991 Funhoff et al. ................. 430/21
5,141,311 A * 8/1992 Hickel et al. .................. 356/136
5,322,798 A * 6/1994 Sadowski ...................... 436/113
5,434,663 A * 7/1995 Maule ........................... 356/300
5,451,980 A * 9/1995 Simon et al. .................... 345/88
5,943,136 A * 8/1999 Pipino et al. .................. 356/440
6,421,128 B1 * 7/2002 Salamon et al. .............. 356/445
7,474,404 B2 * 1/2009 VanWiggeren ............... 356/445
7,652,425 B2 1/2010 Niigaki et al.
7,816,866 B2 10/2010 Nakajima et al.
7,820,968 B2 * 10/2010 Sakemoto et al. ............ 250/330
2002/0048304 A1 * 4/2002 Barnes et al. ................... 372/99
2002/0122179 A1 * 9/2002 Pipino ........................... 356/440
2004/0142482 A1 * 7/2004 Westphal et al. ............. 436/164
2006/0139921 A1 * 6/2006 Saeki ............................ 362/253
2006/0210425 A1 * 9/2006 Mirkarimi ....................... 422/56
2008/0042563 A1 * 2/2008 Niigaki et al. ................ 313/542
2008/0130004 A1 * 6/2008 Pyo et al. ...................... 356/445

(Continued)

FOREIGN PATENT DOCUMENTS

JP 60-180052 A 9/1985
JP 09-213204 A 8/1997

(Continued)

OTHER PUBLICATIONS

H. Raether; "Surface PL;Asmons on Smooth and Rough Surfaces and on Gratings"; Springer Tracts in Modern Physics; New York; pp. 16-19; 1988.

(Continued)

*Primary Examiner* — Christine Sung

(74) *Attorney, Agent, or Firm* — Holtz, Holtz, Goodman & Chick, P.C.

(57) ABSTRACT

A photocathode apparatus is constructed by a transparent body adapted to receive incident light, and a metal cover layer formed on a surface of the transparent body. The incident light reaches an incident/reflective surface of the metal cover layer through the surface of the transparent body to excite surface plasmon resonance light in the incident/reflective surface of the metal cover layer, thus emitting photoelectrons from a photoelectric surface of the metal cover layer opposite to the incident/reflective surface thereof by the photoelectric effect of one of the surface plasmon resonance photons and its second harmonic generation wave.

16 Claims, 10 Drawing Sheets

U.S. PATENT DOCUMENTS

| | | | | |
|---|---|---|---|---|
| 2009/0084166 | A1* | 4/2009 | Robotti | 73/53.01 |
| 2009/0141376 | A1* | 6/2009 | Smith et al. | 359/833 |
| 2009/0161088 | A1* | 6/2009 | Hansen et al. | 355/67 |
| 2009/0251707 | A1* | 10/2009 | Ho et al. | 356/491 |

FOREIGN PATENT DOCUMENTS

| | | | |
|---|---|---|---|
| JP | 2003-249164 | A | 9/2003 |
| JP | 2007-123176 | A | 5/2007 |
| JP | 2007-225395 | A | 9/2007 |
| JP | 2008-016293 | A | 1/2008 |

OTHER PUBLICATIONS

Japanese Office Action dated Jun. 19, 2012 (and partial English translation thereof) in counterpart Japanese Application No. 2008-127943.

* cited by examiner

FOR QUARTZ GLASS PRISM 1

$$\begin{cases} n_1 = 1.500 \\ k_1 = 0 \end{cases}$$

FOR Al LAYER 2

$$\begin{cases} n_2 = 0.2090 \\ k_2 = 3.11 \end{cases}$$

PHOTOCATHODE APPARATUS USING PHOTOELECTRIC EFFECT OF SURFACE PLASMON RESONANCE PHOTONS

BACKGROUND OF THE INVENTION

1. Field of the Invention

The present invention relates to a photocathode apparatus for emitting photoelectrons.

2. Description of the Related Art

Generally, a photocathode apparatus has been used as a photoelectric surface of a photomultiplier tube, an electron beam source of a large-scale accelerator, a bright electron beam generating apparatus or an image pickup apparatus.

A first prior art photocathode apparatus includes a cathode made of metal such as Au or Cu, or semiconductor such as GaAs. In this first prior art photocathode apparatus, the irradiation surface of the cathode is irradiated with photons having an energy larger than the work function of the cathode, photoelectrons are emitted from the irradiation surface of the cathode due to the photoelectric effect.

In the above-described first prior art photocathode apparatus, however, since the reflectivity of the cathode is very high, the ratio of the number of photoelectrons emitted from the irradiation surface of the cathode to the number of photons incident thereto, i.e., the quantum efficiency η is very low or about $10^{-3}$ to $10^{-4.}$ In a second prior art photocathode apparatus, the irradiation surface of the cathode of the first prior art photocathode apparatus is deposited by alkali metal such as Cs or alkali metal compound to decrease the work function of the cathode, which would increase the quantum efficiency η (see: JP-60-180052 A and JP-9-213204 A). In this case, the quantum efficiency η is high or about $10^{-1}$. That is, the quantum efficiency η of the second prior art photocathode apparatus is about $10^2$ to $10^3$ times that of the first prior art photocathode apparatus.

In the above-described second prior art photocathode apparatus, however, since the alkali metal or alkali metal compound on the irradiation surface is irradiated with intense light, the alkali metal or alkali metal compound would deteriorate, so that the lifetime of the apparatus would be shortened, for example, the lifetime would be about 100 hours.

Also, in the above-described second prior art photocathode apparatus, since the alkali metal or alkali metal compound is easily oxidized, the above-described second prior art photocathode apparatus must be operated in an ultra high vacuum state of $10^{-8}$ Pa, which would require ultra high vacuum equipment, thus increasing the manufacturing cost.

SUMMARY OF THE INVENTION

The present invention seeks to solve one or more of the above-described problems.

According to the present invention, a photocathode apparatus is constructed by a transparent body adapted to receive incident light, and a metal cover layer formed on a surface of the transparent body. The incident light re-aches an incident/reflective surface of the metal cover layer through the surface of the transparent body to excite surface plasmon resonance light in the incident/reflective surface of the metal cover layer, thus emitting photoelectrons from, a photoelectric surface of the metal cover layer opposite to the incident/reflective surface thereof by the photoelectric effect of one of the surface plasmon resonance photons and its second harmonic generation wave. Thus, the number of photoelectrons emitted by surface plasmon resonance photons is increased, so that the quantum efficiency η is increased. Also, since there is no alkali metal or no alkali metal compound, the lifetime of the apparatus would be increased, and no ultra high vacuum equipment would be necessary.

Also, an incident angle of the incident light to the metal cover layer is a light absorption dip angle by which a reflectivity of the incident light at the incident/reflective surface of the metal cover layer is minimum in a total reflection region.

Further, a thickness of the metal cover layer is determined so that the reflectivity of the incident light at the incident/reflective surface of the metal cover layer is minimum when the incident light is incident at the light absorption dip angle to the incident/reflective surface of the metal cover layer.

Further, one of an alkali metal layer and an alkali metal compound layer is deposited on the photoelectric surface of the metal cover layer. Thus, the work function of the metal cover layer is decreased, but ultra high vacuum equipment would be necessary. The thickness of the alkali metal layer or the alkali metal compound layer is determined so that the reflectivity of the incident light at the light absorption dip angle is minimum.

Further, a plurality of holes are perforated in the metal cover layer, and a diameter of each of the holes is smaller than a wavelength of the incident light. Thus, surface plasmon resonance photons are easily generated.

According to the present invention, the quantum efficiency η can be increased, and also, the lifetime of the apparatus can be increased. Further, the manufacturing cost can be decreased.

BRIEF DESCRIPTION OF THE DRAWINGS

The above and other objects, advantages and features of the present invention will be more apparent from the following description of certain preferred embodiments, taken in conjunction with the accompanying drawings, wherein.

DETAILED DESCRIPTION OF PREFERRED EMBODIMENTS

Figure 1:
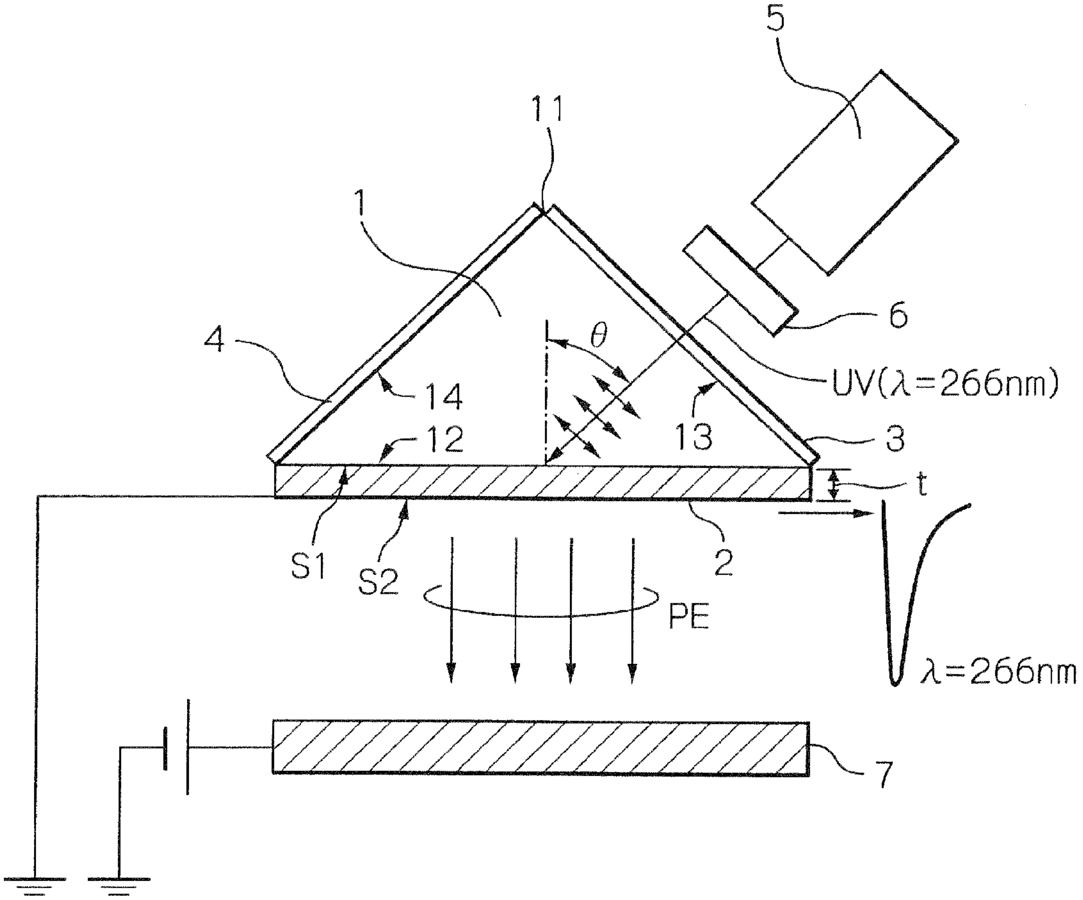
FIG. 1 is a cross-sectional view illustrating a first embodiment of the photocathode apparatus according to the present invention.

In FIG. 1, which illustrates a first embodiment of the photocathode apparatus according to the present invention, this photocathode apparatus is constructed by a quartz glass prism 1 as a transparent body for ultraviolet laser rays with a reflectivity $n_1$ of 1.50 and a vertical angle of 90°, and an aluminum layer 2 as a metal cover layer deposited by an evaporating process or the like on a surface 12 of the quartz glass prism 1 opposing the arris 11 thereof.

The aluminum layer 2 is about 1 cm long and about 10 nm to 10 μm thick. If the thickness t of the aluminum layer 2 is less than 10 nm, the generation of photons by the surface plasmon resonance (SPR) would be suppressed. On the other hand, if the thickness t of the aluminum layer 2 is more than 10 μm, the generation of evanescent photons in the aluminum layer 2 is attenuated, so as not to excite SPR photons on the photoelectric surface S2 of the aluminum layer 2.

Note that an about 1 to 2 nm thick metal layer made of Cr or the like may be deposited on the surface of the quartz glass prism 1 to enhance the contact characteristics between the aluminum layer 2 and the quartz glass prism 1.

An anti-reflection (AR) coating layer 3 is coated on a surface 13 of the quartz glass prism 1, while a reflection (R) coating layer 4 is coated on a surface 14 of the quartz glass prism 1. In this case, the arris 11 of the quartz glass prism 1 is formed by the surfaces 13 and 14 thereof. Note that, if the incident loss by the reflectivity such as 8% of the quartz glass prism 1 is negligible, the AR coating layer 3 can be omitted.

Further, an ultraviolet laser source 5 and a wavelength plate 6 are provided. As a result, an ultraviolet laser ray UV whose wavelength λ is 266 nm is emitted from the ultraviolet laser source 5 and is incident via the wavelength plate 6, the AR coating layer 3 and the quartz glass prism 1 to the aluminum layer 2. In this case, in order to excite SPR photons on the photoelectric surface S2 of the aluminum layer 2, the rotational angle of the wavelength plate 6 can be adjusted, so that the ultraviolet laser ray UV incident to the aluminum layer 2 is polarized, i.e., TM-polarized or P-polarized in parallel with the incident/reflective surface S1 of the aluminum layer 2.

Note that, since the ultraviolet laser ray UV is linearly-polarized, the rotational angle of the ultraviolet laser source 5 can be adjusted without provision of the wavelength plate 6 to emit the above-mentioned P-polarized light.

Still, in order to extract photoelectrons PE emitted from the photoelectric surface S2 of the aluminum layer 2, a photoelectron extracting electrode 7 opposing the aluminum layer 2 is provided. In this case, the aluminum layer 2 is grounded, while a positive voltage is applied to the photoelectron extracting electrode 7.

The photocathode apparatus of FIG. 1 except for the ultraviolet laser source 5 and the wavelength plate 6 is mounted in a vacuum container (not shown); however, since this vacuum container would not require an ultra high vacuum state, the manufacturing cost would not be increased.

The operational principle of the photocathode apparatus of FIG. 1 is to generate evanescent photons in the aluminum layer 2 by the ultraviolet laser ray UV to excite SPR photons on the photoelectric surface S2 of the aluminum layer 2. In this case, since the ultraviolet laser ray UV is P-polarized, the ultraviolet laser ray UV has an electric field component in parallel with the surface of the aluminum layer 2 and another electric field perpendicular to the surface of the aluminum layer 2, so that the respective electric fields are amplified. For example, the intensity of the electric field of a light incident to the aluminum layer 2 is amplified about ten times by the SPR photons generated therein. Therefore, since the intensity of the light incident to the aluminum layer 2 is represented by a square value of the electric field, the light incident to the aluminum layer 2 is amplified by about 100 (=10×10) times. As a result, photoelectrons PE emitted from the photoelectric surface S2 of the aluminum layer 2 is increased by about 100 times.

Regarding the surface plasmon resonance (SPR) photons, reference is made to Heinz Raether, "Surface Plasmons on Smooth and Rough Surfaces and on Gratings", Springer-Verlag Berlin Heidelberg N.Y., pp. 16 to 19, 1988.

Further, in the photocathode apparatus of FIG. 1, in order to exhibit the photoelectric effect of the aluminum layer 2, the energy of the ultraviolet laser ray UV must be larger than the work function of the aluminum layer 2. The work function of the aluminum layer 2 is 4.2 eV corresponding to a wavelength of 292 nm. Therefore, the wavelength of the ultraviolet laser ray UV must be smaller than 292 nm. For example, use is made of a fourth harmonic wave, whose wavelength is 266 nm, of an yttrium aluminum garnet (YAG)-laser as the ultraviolet laser source 5.

Figure 2:
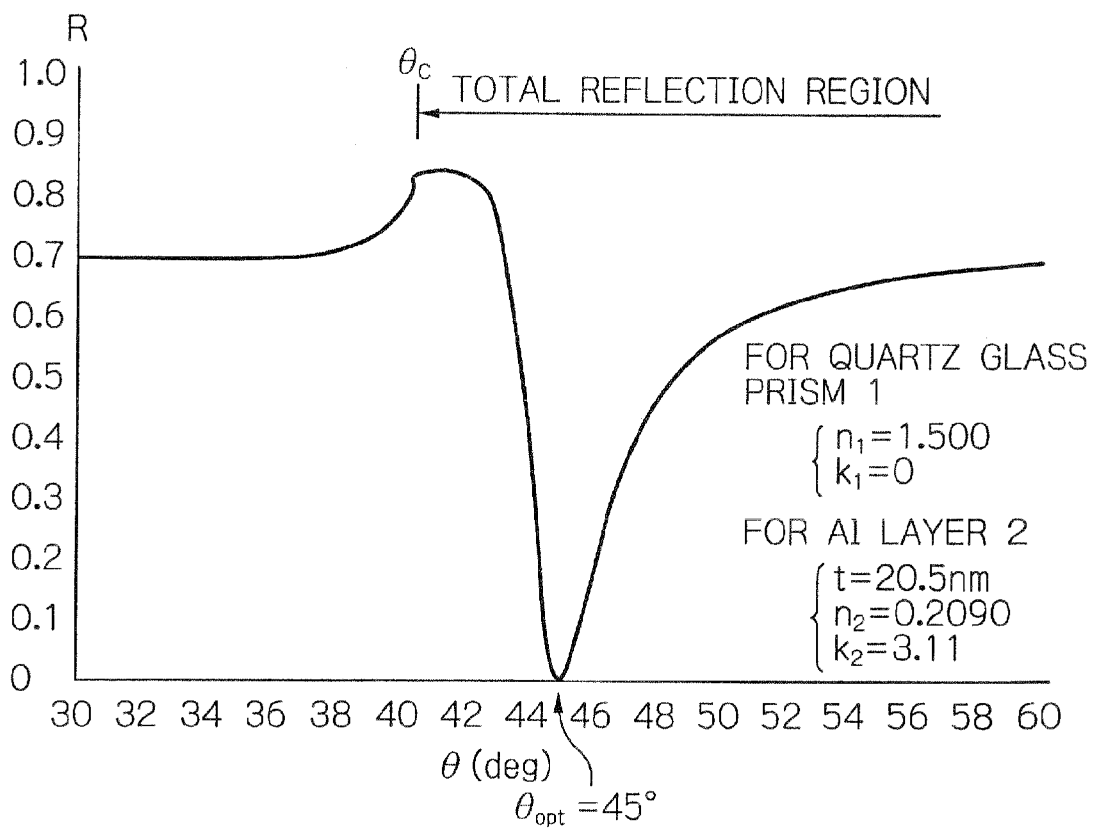
FIG. 2 is an attenuated total reflection (ATR) signal spectrum diagram for explaining an optimum incident angle of the ultraviolet laser ray to the aluminum layer of the photocathode apparatus of FIG. 1.

Referring to FIG. 2, which is an ATR signal spectrum diagram for explaining an optimum incident angle Sops of the ultraviolet laser ray UV to the aluminum layer 2 of the photocathode apparatus of FIG. 1, when the incident angle θ of the ultraviolet laser ray UV at the incident/reflective surface S1 of the aluminum layer 2 is an optimum incident angle $\theta_{opt}>\theta_c$ where $\theta_c$ is a critical angle, the number of SPR photons excited on the photoelectric surface S2 of the aluminum layer 2 of FIG. 1 is maximum. In other words, when $\theta=\theta_{opt}>\theta_c$, the reflectivity R at the incident/reflective surface S1 of the aluminum layer 2 is minimum. In this case, FIG. 2 was obtained by a simulation which calculates a reflectivity R of light reflected from the incident/reflective surface S1 of the aluminum layer 2 by angularly scanning the quartz glass prism 1 with the ultraviolet laser ray UV. This simulation can be carried out by the simulation software WinSpall (trademark) developed by Max Planck Institute.

In FIG. 2, the simulation conditions are as follows:

1) The wavelength λ of the ultraviolet laser ray UV is 266 nm.
2) For the quartz glass prism 1,
   the refractive index $n_1$ is 1.500; and
   the extinction coefficient $k_1$ is 0.
3) For the aluminum layer 2,
   the refractive index $n_2$ is 0.209;
   the extinction coefficient $k_2$ is 3.11; and
   the thickness t is 20.5 nm.

As shown in FIG. 2, when $\theta=45°>\theta_c=40.3°$, the reflectivity R is 0 which shows a sharp plasmon dip. Therefore, the optimum incident angle $\theta_{opt}$ is 45° by which the excited SPR photons are maximum.

Figure 3:
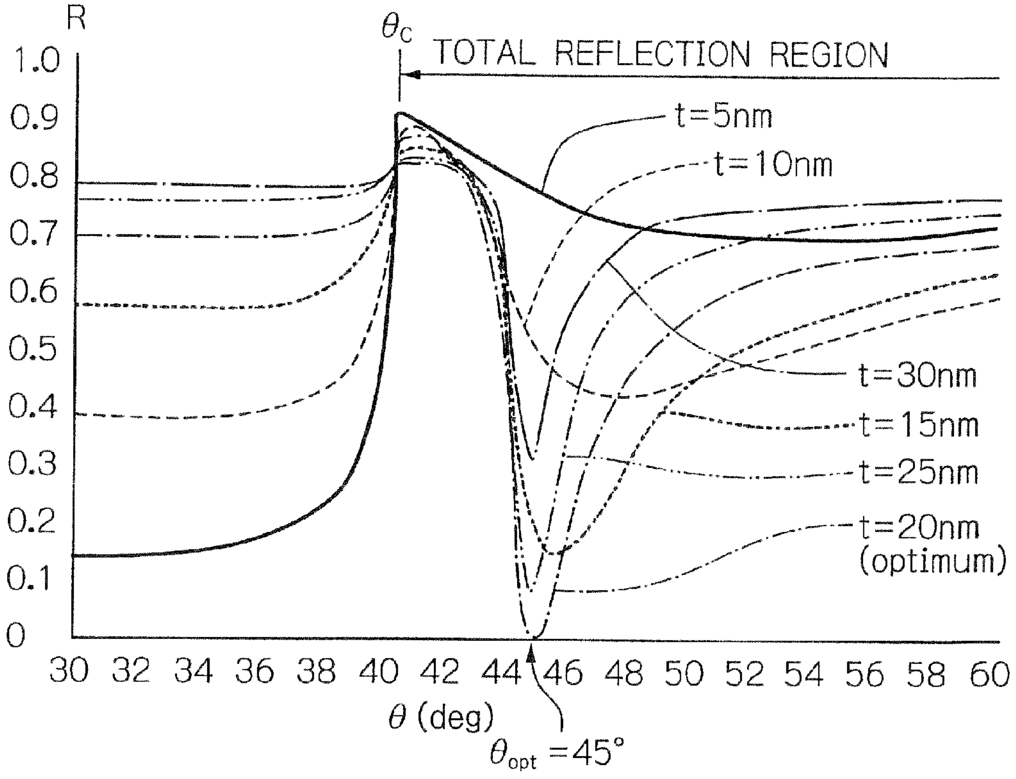
FIG. 3 is an ATR signal spectrum diagram for explaining an optimum thickness of the aluminum layer of the photocathode apparatus of FIG. 1.

Referring to FIG. 3, which is an ATR signal spectrum diagram for explaining an optimum thickness $t_{opt}$ of the aluminum layer 2 of the photocathode apparatus of FIG. 1, when the thickness t of the aluminum layer 2 is an optimum thickness $t_{opt}$, the number of SPR photons excited on the photoelectric surface S2 of the aluminum layer 2 of FIG. 1 is maximum. In other words, when $t=t_{opt}$, the reflectivity R at the incident/reflective surface S1 of the aluminum layer 2 is minimum. In this case, FIG. 3 was obtained by a simulation which calculates a reflectivity R of light reflected from the incident/reflective surface S1 of the aluminum layer 2 by angularly scanning the quartz glass prism 1 with the ultraviolet laser ray UV by the above-mentioned simulation software WinSpall (trademark).

In FIG. 3, the simulation conditions are as follows:

1) The wavelength λ of the ultraviolet laser ray UV is 266 nm.

2) For the quartz glass prism 1,
the refractive index $n_1$ is 1.500; and
the extinction coefficient $k_1$ is 0.

3) For the aluminum layer 2,
the refractive index $n_2$ is 0.209;
the extinction coefficient $k_2$ is 3.11; and
the thickness t is variable.

As shown in FIG. 3, when the thickness t of the aluminum layer 2 is less than 15 nm, evanescent photons generated in the aluminum layer 2 cannot be sufficiently absorbed therein, so that no plasmon dip is exhibited. On the other hand, when the thickness t of the aluminum layer 2 is more than 25 nm, evanescent photons generated in the aluminum layer 2 are attenuated so as not to excite SPR photons on the photoelectric surface S2 of the aluminum layer 2. In other words, the reflectivity R at the plasmon dip is large.

Thus, as shown in FIG. 3, an ATR signal spectrum where the thickness t of the aluminum layer 2 is 20±1 nm exhibits a sharp plasmon dip. In other words, the optimum thickness $t_{opt}$ of the aluminum layer 2 is 20±1 nm.

In the photocathode apparatus of FIG. 1, a spectrum width of the ultraviolet laser ray UV should be considered. That is, when the ultraviolet laser ray UV is a pulse signal whose duration is on the order of picosecond, the spectrum width of this pulse signal has a frequency of about 1000 GHz, so that its ATR signal spectrum exhibits a sharp plasmon dip. Therefore, photoelectrons PE follow on the basis of picosecond. On the other hand, when the ultraviolet laser ray UV is a pulse signal whose duration is on the order of femtosecond, the spectrum width of this pulse signal is so broad that excitation beyond the resonance line width is carried out. Therefore, the limit of the pulse width of the ultraviolet laser ray UV is about 10 to 100 femtosecond.

Figure 4:
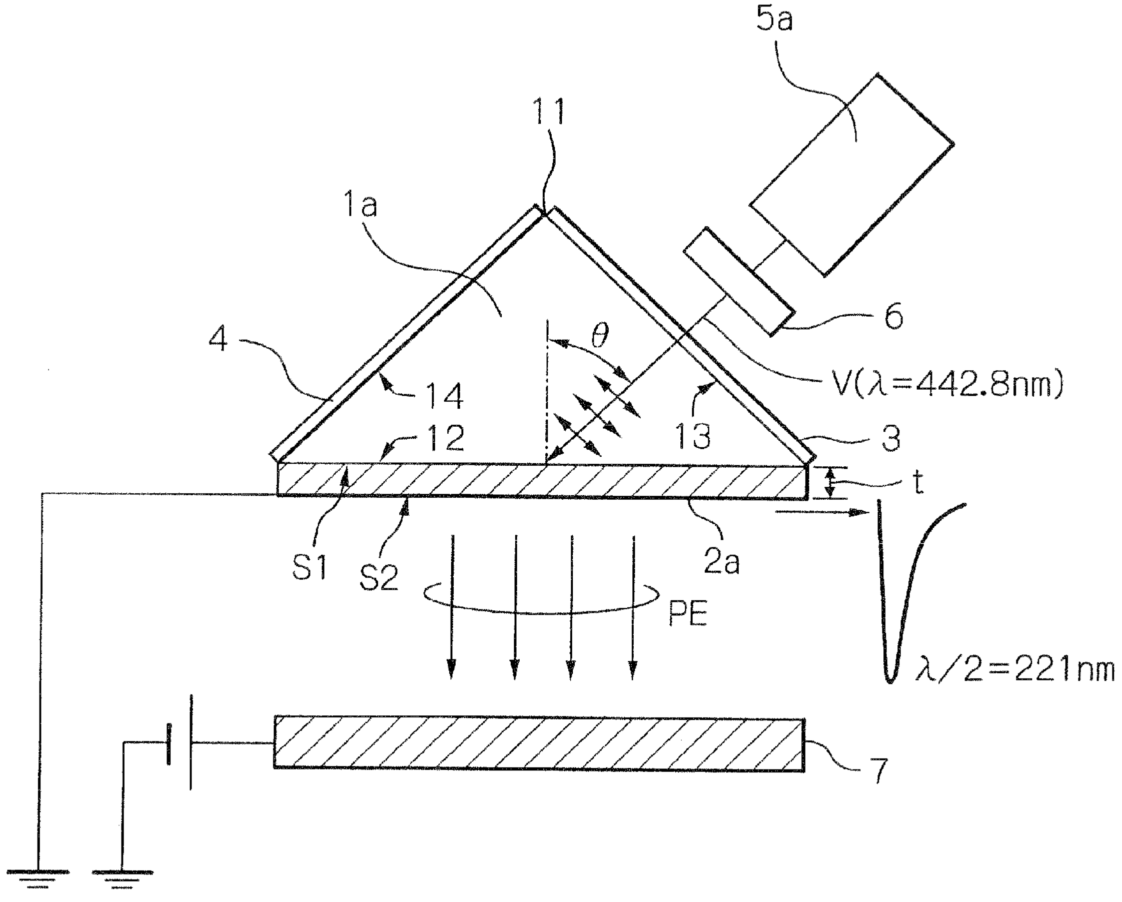
FIG. 4 is a cross-sectional view illustrating a second embodiment of the photocathode apparatus according to the present invention.

In FIG. 4, which illustrates a second embodiment of the photocathode apparatus according to the present invention, the quartz glass prism 1, the aluminum layer 2 and the ultraviolet laser source 5 of FIG. 1 are replaced by a common glass prism or a BK-7 prism 1*a* whose reflective index $n_1$ is 1.535, a silver (Ag) layer 2*a* and a visible laser source 5*a*, respectively.

A visible laser ray V emitted from the visible laser source 5*a* has a wavelength λ of 442 nm, and therefore, the energy of the visible laser ray V is lower than that of the ultraviolet laser ray UV of FIG. 1. Therefore, since the BK-7 prism 1*a* is non-transparent for the ultraviolet laser ray UV of FIG. 1, but is transparent for the visible laser ray V of the BK-7 prism 1*a*, which is inexpensive as compared with the quartz glass prism 1, can be used.

The photocathode apparatus of FIG. 4 except for the visible laser source 5*a* and the wavelength plate 6 is mounted in a vacuum container (not shown); however, even in this case, since this vacuum container would not require an ultra high vacuum state, the manufacturing cost would not be increased.

The operational principle of the photocathode apparatus of FIG. 4 is to generate evanescent photons in the Ag layer 2*a* by the visible laser ray V to excite surface second harmonic generation (SHG) waves of SPR photons on the photoelectric surface S2 of the Ag layer 2*a*. That is, if wavelength λ of the visible laser ray V is 442.8 nm, the wavelength of the SPR of the Ag layer 2*a* is 400 to 600 nm, so as to efficiently excite the surface SHG waves of SPR photons. In this case, the surface SHG waves of SPR photons have a wavelength λ of 221.4 nm.

Further, in the photocathode apparatus of FIG. 4, in order to exhibit the photoelectric effect of the Ag layer 2*a*, the energy of the visible laser ray V must be larger than the work function of the Ag layer 2*a*. In this case, however, since use is made of the surface SHG waves of SPR photons, the energy of the visible laser ray V becomes twice in the Ag layer 2*a*. Therefore, if the wavelength of the visible laser source 5*a* is 400 to 600 nm, the visible laser ray V can efficiently excite SPR photons, and the energy of the surface SHG waves of SPR photons can be larger than the work function (=4.25 eV) of the Ag layer 2*a*.

Figure 5:
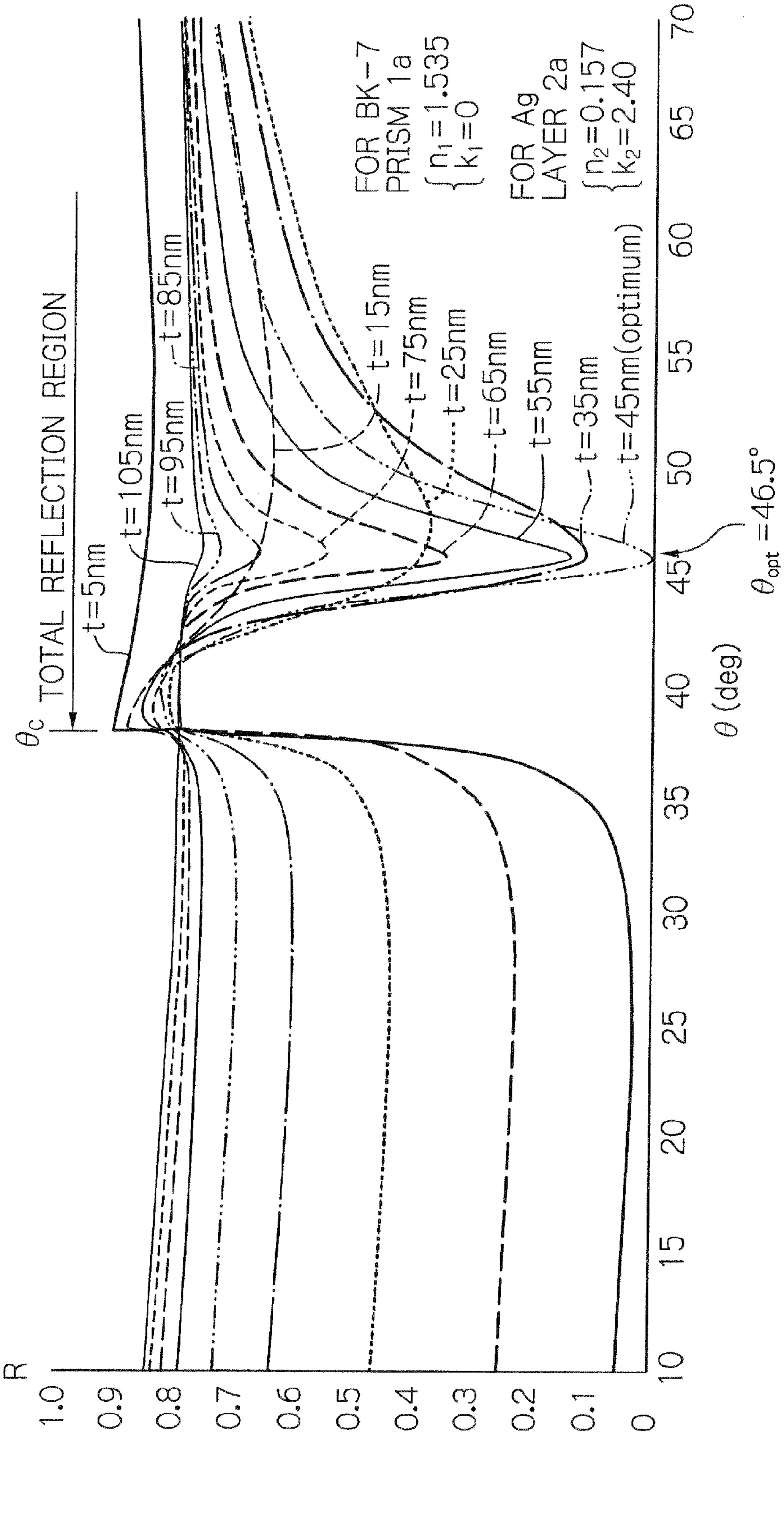
FIG. 5 is an ATR signal spectrum diagram for explaining an optimum incident angle of the visible laser ray to the silver layer and an optimum thickness of the silver layer of the photocathode apparatus of FIG. 4.

Referring to FIG. 5, which is an ATR signal spectrum diagram for explaining an optimum incident angle $\theta_{opt}$ of the visible laser ray V to the Ag layer 2*a* and an optimum thickness of the Ag layer 2*a* of the photocathode apparatus of FIG. 4, when the incident angle θ of the visible laser ray V at the incident/reflective surface S1 of the Ag layer 2*a* is an optimum incident angle $\theta_{opt}>\theta_c$ where $\theta_c$ is a critical angle, the number of SPR photons excited on the photoelectric surface S2 of the Ag layer 2*a* of FIG. 4 is maximum. In other words, when $\theta=\theta_{opt}>\theta_c$, the reflectivity R at the incident/reflective surface S1 of the Ag layer 2*a* is minimum. In this case, FIG. 5 was obtained by a simulation which calculates a reflectivity R of light reflected from the incident/reflective surface S1 of the Ag layer 2*a* by angularly scanning the BK-7 prism 1*a* with the visible laser ray V. This simulation can be also carried out by the simulation software WinSpall (trademark).

In FIG. 5, the simulation conditions are as follows:

1) The wavelength λ of the visible laser ray V is 442.8 nm.

2) For the BK-7 prism 1*a*,
the refractive index $n_1$ is 1.535; and
the extinction coefficient $k_1$ is 0.

3) For the Ag layer 2*a*,
the refractive index $n_2$ is 0.157; and
the extinction coefficient $k_2$ is 2.4.

As shown in FIG. 5, when $\theta=46.5°>\theta_c=36.3°$, the reflectivity R is 0 which shows a sharp plasmon dip. Therefore, the optimum incident angle $\theta_{opt}$ is 48° by which the excited second harmonic waves of SPR photons are maximum.

Also, when the thickness t of the Ag layer 2*a* is an optimum thickness $t_{opt}$, the number of excited second harmonic waves of SPR photons on the photoelectric surface S2 of the Ag layer 2*a* of FIG. 4 is maximum. In other words, when $t=t_{opt}$, the reflectivity R at the incident/reflective surface S1 of the Ag layer 2*a* is minimum.

As shown in FIG. 5, when the thickness t of the Ag layer 2*a* is less than 35 nm, evanescent photons generated in the Ag layer 2*a* cannot be sufficiently absorbed therein, so that no plasmon dip is exhibited. On the other hand, when the thickness t of the Ag layer 2*a* is more than 55 nm, evanescent photons generated in the Ag layer 2*a* are attenuated so as not to excite SHG waves of SPR photons on the photoelectric surface S2 of the Ag layer 2*a*. In other words, the reflectivity R at the plasmon dip is large.

Thus, as shown in FIG. 5, an ATR signal spectrum where the thickness t of the Ag layer 2*a* is 45±1 nm exhibits a sharp plasmon dip. In other words, the optimum thickness $t_{opt}$ of the Ag layer 2*a* is 45±1 nm.

Figure 6:
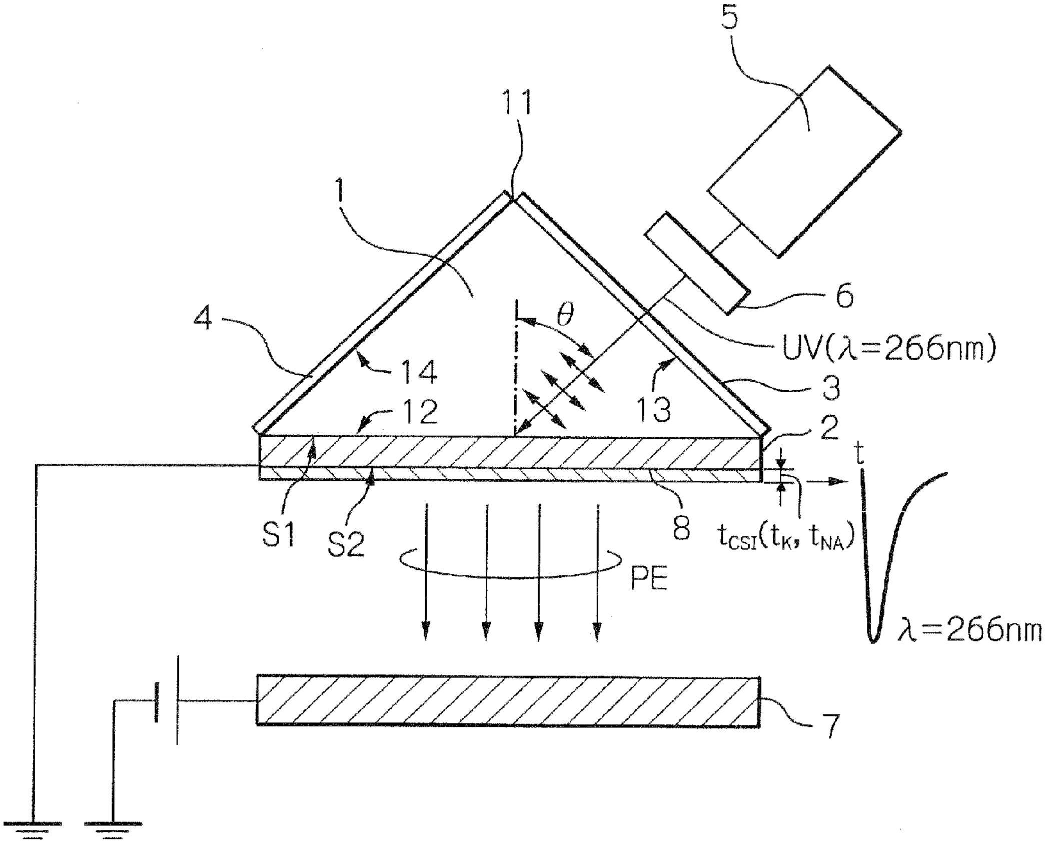
FIG. 6 is a cross-sectional view illustrating a third embodiment of the photocathode apparatus according to the present invention.

In FIG. 6, which illustrates a third embodiment of the photocathode apparatus according to the present invention, an alkali metal (or alkali metal compound) layer 8 is formed on the photoelectric surface S2 of the aluminum layer 2 of FIG. 1, which decreases the work function of the aluminum layer 2, thus increasing the quantum efficiency η.

The photocathode apparatus of FIG. 6 except for the ultraviolet laser source 5 and the wavelength plate 6 is also mounted in a vacuum container (not shown); in this case, since the alkali metal or alkali metal compound is easily oxidized, this vacuum container would require an ultra high vacuum state, so that the manufacturing cost would be increased as compared with the photocathode apparatuses of FIGS. 1 and 4. Also, since the alkali metal or alkali metal compound on the irradiation surface is irradiated with intense light; the alkali metal or alkali metal compound would deteriorate, so that the lifetime of the apparatus would be shortened, for example, the lifetime would be about 100 hours.

Figure 7:
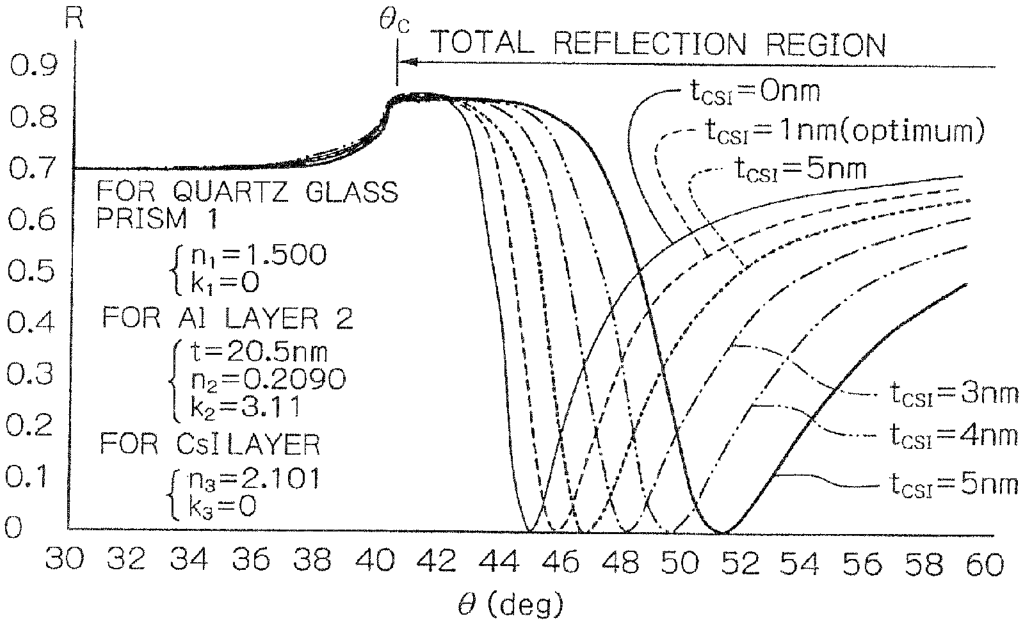
FIG. 7 is an ATR signal spectrum diagram for explaining an optimum thickness of the CsI layer of the photocathode apparatus of FIG. 6.

Referring to FIG. 7, which is an ATR signal spectrum diagram for explaining an optimum thickness $t_{CSI}$ of a CsI layer as the alkali metal or alkali metal compound layer 8 of the photocathode apparatus of FIG. 6, when the thickness $t_{CSI}$ of the CsI layer is an optimum thickness, the number of SPR photons excited on the photoelectric surface S2 of the aluminum layer 2 of FIG. 6 is maximum. In other words, the reflectivity R at the incident/reflective surface S1 of the aluminum layer 2 is minimum. In this case, FIG. 7 was obtained by a simulation which calculates a reflectivity R of light reflected from the incident/reflective surface S1 of the aluminum layer 2 by angularly scanning the quartz glass prism 1 with the ultraviolet laser ray UV by the above-mentioned simulation software WinSpall (trademark).

In FIG. 7, the simulation conditions are as follows:

1) The wavelength $\lambda$ of the ultraviolet laser ray UV is 266 nm.
2) For the quartz glass prism 1,
   the refractive index $n_1$ is 1.500; and
   the extinction coefficient $k_1$ is 0.
3) For the aluminum layer 2,
   the refractive index $n_2$ is 0.209;
   the extinction coefficient $k_2$ is 3.11; and
   the thickness t is 20.5 nm.
4) For the CsI layer,
   the refractive index $n_3$ is 2.101; and
   the extinction coefficient $k_3$ is 0.

As shown in FIG. 7, when the thickness $t_{CSI}$ is changed from 0 nm to 5 nm, the plasmon resonance dip is shifted toward the larger incident angle $\theta$. However, since the CsI layer has no light absorption ($k_3$=0), an ATR signal spectrum always exhibits a sharp plasmon dip having a reflectivity R of 0 regardless of the thickness $t_{CSI}$ of the CsI layer, thus exciting SPR photons with a higher quantum efficiency $\eta$. For example, the optimum thickness $t_{opt}$ (=20.5 nm) of the aluminum layer 2 is unchanged, while the thickness $t_{CSI}$ of the CsI layer is 1 nm.

Figure 8:
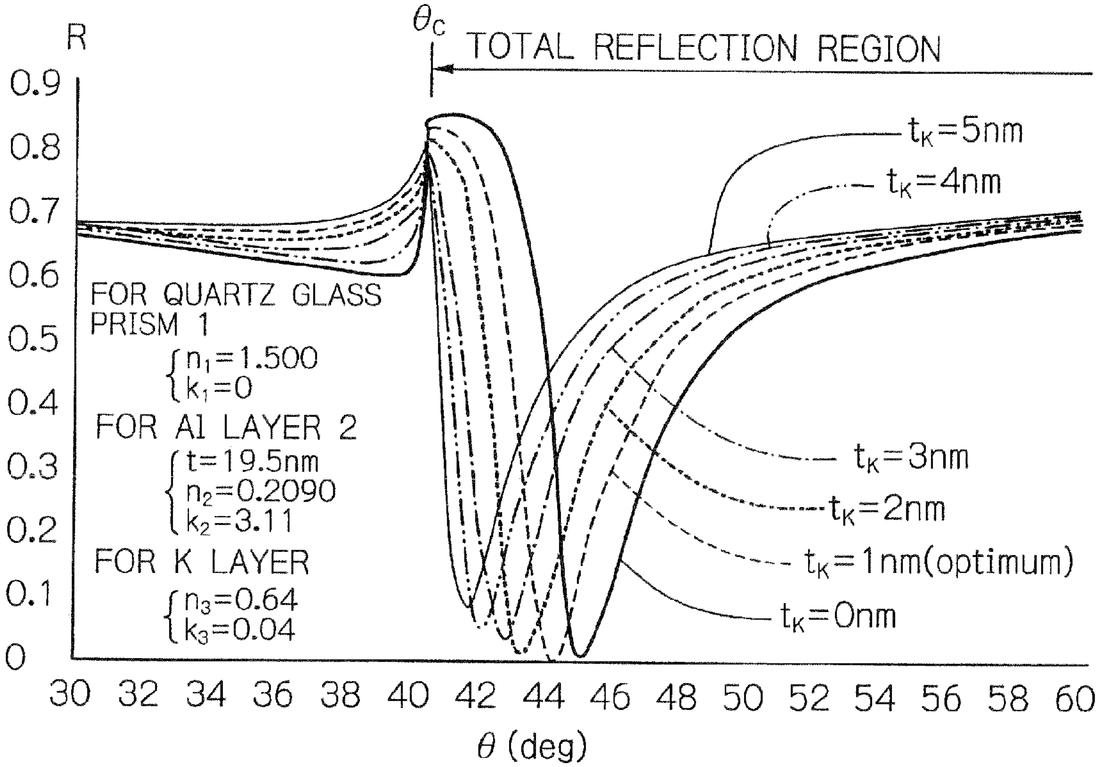
FIG. 8 is an ATR signal spectrum diagram for explaining an optimum thickness of the K layer of the photocathode apparatus of FIG. 6.

Referring to FIG. 8, which is an ATR signal spectrum diagram for explaining an optimum thickness $t_K$ of a K layer as the alkali metal or alkali metal compound layer 8 of the photocathode apparatus of FIG. 6, when the thickness $t_K$ of the K layer is an optimum thickness, the number of SPR photons excited on the photoelectric surface S2 of the aluminum layer 2 of FIG. 6 is maximum. In other words, the reflectivity R at the incident/reflective surface S1 of the aluminum layer 2 is minimum. In this case, FIG. 8 was obtained by a simulation which calculates a reflectivity R of light reflected from the incident/reflective surface S1 of the aluminum layer 2 by angularly scanning the quartz glass prism 1 with the ultraviolet laser ray UV by the above-mentioned simulation software WinSpall (trademark).

In FIG. 8, the simulation conditions are as follows:

1) The wavelength $\lambda$ of the ultraviolet laser ray UV is 266 nm.
2) For the quartz glass prism 1,
   the refractive index $n_1$ is 1.500; and
   the extinction coefficient $k_1$ is 0.
3) For the aluminum layer 2,
   the refractive index $n_2$ is 0.209;
   the extinction coefficient $k_2$ is 3.11; and
   the thickness t is 19.5 nm.
4) For the K layer,
   the refractive index $n_3$ is 0.64; and
   the extinction coefficient $k_3$ is 0.04.

As shown in FIG. 8, when the thickness $t_K$ is changed from 0 nm to 5 nm, the plasmon resonance dip is shifted toward the smaller incident angle $\theta$. However, since the K layer has a little light absorption ($k_3$=0.04), the optimum thickness $t_{opt}$ (=20.5 nm) of the aluminum layer 2 without the K layer is decreased by 1 nm, so that the thickness of the aluminum layer 2 is 19.5 nm, while the thickness $t_K$ of the K layer is 1 nm. In this case, an ATR signal spectrum exhibits a sharp plasmon dip having a reflectivity R of 0, thus exciting SPR photons with a higher quantum efficiency $\eta$.

Figure 9:
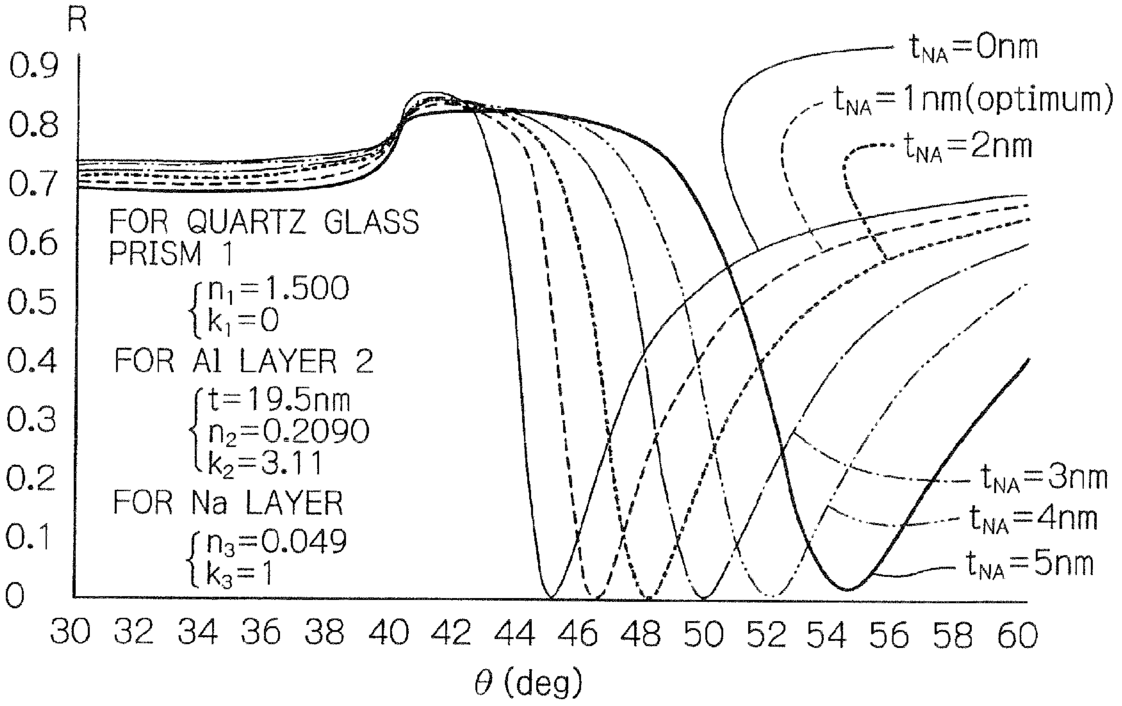
FIG. 9 is an ATR signal spectrum diagram for explaining an optimum thickness of the Na layer of the photocathode apparatus of FIG. 6.

Referring to FIG. 9, which is an ATR signal spectrum diagram for explaining an optimum thickness $t_{NA}$ of a Na layer as the alkali metal or alkali metal compound layer 8 of the photocathode apparatus of FIG. 6, when the thickness $t_{NA}$ of the Na layer is an optimum thickness, the number of SPR photons excited on the photoelectric surface S2 of the aluminum layer 2 of FIG. 6 is maximum. In other words, the reflectivity R at the incident/reflective surface S1 of the aluminum layer 2 is minimum. In this case, FIG. 9 was obtained by a simulation which calculates a reflectivity R of light reflected from the incident/reflective surface S1 of the aluminum layer 2 by angularly scanning the quartz glass prism 1 with the ultraviolet laser ray UV by the above-mentioned simulation software WinSpall (trademark).

In FIG. 9, the simulation conditions are as follows:

1) The wavelength $\lambda$ of the ultraviolet laser ray UV is 266 nm.
2) For the quartz glass prism 1,
   the refractive index $n_1$ is 1.500; and
   the extinction coefficient $k_1$ is 0.
3) For the aluminum layer 2,
   the refractive index $n_2$ is 0.209;
   the extinction coefficient $k_2$ is 3.11; and
   the thickness t is 19.5 nm.
4) For the Na layer,
   the refractive index $n_3$ is 0.049; and
   the extinction coefficient $k_3$ is 1.

As shown in FIG. 9, when the thickness $t_{NA}$ is changed from 0 nm to 5 nm, the plasmon resonance dip is shifted toward the larger incident angle $\theta$. However, since the Na layer has a little light absorption ($k_3$=1.0), the optimum thickness $t_{opt}$ (=20.5 nm) of the aluminum layer 2 without the Na layer is decreased by 1 nm, so that the thickness of the aluminum layer 2 is 19.5 nm, while the thickness $t_{NA}$ of the Na layer is 1 nm. In this case, an ATR signal spectrum exhibits a sharp plasmon dip having a reflectivity R of 0, thus exciting SPR photons with a higher quantum efficiency $\eta$.

In FIG. 4, note that an alkali metal or alkali metal compound layer 8 of FIG. 6 can be deposited onto the photoelectric surface S2 of the Ag layer 2*a*, which decreases the work function of the Ag layer 2*a*, thus increasing the quantum efficiency $\eta$. In this case, if the alkali metal or alkali metal compound layer 8 is a CsI layer, the optimum thickness $t_{opt}$ (=20.5 nm) of the aluminum layer 2 (the optimum thickness $t_{opt}$ (=45 nm) of the Ag layer 2*a*) is unchanged while the thickness $t_{CSI}$ of the CsI layer is 1 nm. On the other hand, if the alkali metal or alkali metal compound layer 8 is a K layer or a Na layer, the optimum thickness $t_{opt}$ (=20.5 nm) of the aluminum layer 2 (the optimum thickness $t_{opt}$ (=45 nm) of the Ag layer 2*a*) is decreased by 1 nm while the thickness $t_K$ of the K layer or the thickness $t_{NA}$ of the Na layer is 1 nm.

Figure 10A:
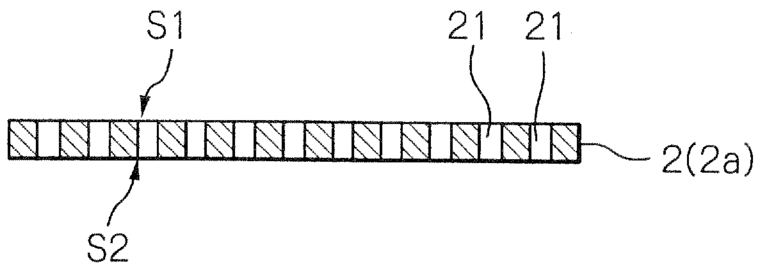
FIG. 10A is a cross-sectional view of a modification of the metal cover layer of FIGS. 1, 4 and 6.
Figure 10B:
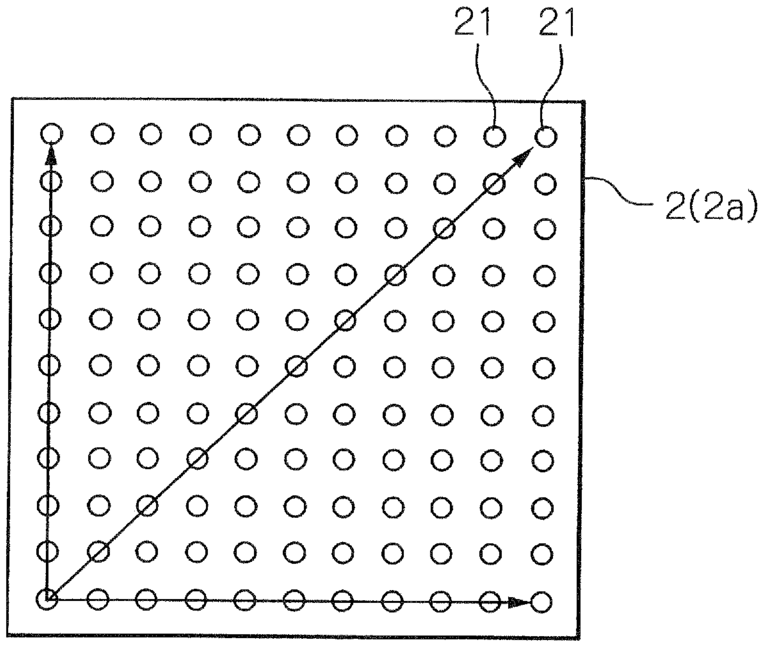
FIG. 10B is a plan view of the modification of FIG. 10A.

FIG. 10A is a cross-sectional view illustrating a modification of the aluminum layer 2 of FIGS. 1 and 6 (or the Ag layer 2*a* of FIG. 4), and FIG. 10B is a plan view of the modification of FIG. 10A.

As illustrated in FIGS. 10A and 10B, holes 21 are regularly perforated in the aluminum layer 2 (or the Ag layer 2*a*). In this case, the holes 21 have a diameter smaller than the wavelength λ of the ultraviolet laser ray UV (or the visible laser ray V). Therefore, when the ultraviolet laser ray UV (or the visible laser ray V) is incident to the incident/reflective surface S1 of the aluminum layer 2 (or the Ag layer 2*a*), a part of the ultraviolet laser ray UV (or the visible laser ray V) is incident into the holes 21, so that this part is hardly radiated from the holes 21 due to the small diameter thereof, while evanescent photons are generated in the aluminum layer 2 (or the Ag layer 2*a*). This phenomenon is known as means for generating evanescent photons using very small holes. Additionally, as indicated by arrows in FIG. 10B, evanescent photons generated in one of the holes 21 propagate into an adjacent one of the holes 21 to enhance the intensity of the evanescent photons. As a result, SPR photons are easily excited on the photoelectric surface S2 of the aluminum layer 2 (or the Ag layer 2*a*) by the enhanced evanescent photons.

The inventor carried out experiments on the first prior art photocathode apparatus and the photocathode apparatus of FIG. 1. That is, the first prior art photocathode apparatus was constructed by a quartz glass prism and an aluminum layer, and the photocathode apparatus of FIG. 1 was constructed by a quartz glass prism and an aluminum layer.

First, the quartz glass prisms were cleaned as follows:

1) The quartz glass prisms were immersed in isopropyl alcohol (IPA) at a temperature of 80° C. for five minutes, and then, held in an ultrasonic wave state for ten minutes;

2) The quartz glass prisms were held in a nitrogen gas blow state; and

3) The quartz glass prisms were subjected to an ultraviolet cleaning process.

Next, one aluminum layer was deposited on each of the quartz glass prisms by the following DC sputtering conditions:

1) The distance between the substrate (prism) and a sputtering target was 170 mm;

2) Ar gas was at 10 sccm;

3) Pressure was $3.4\times10^{-1}$ Pa; and

4) The power was 0.5 kW.

Each of the above-mentioned first prior art photocathode apparatus and the photocathode apparatus of FIG. 1 which were grounded, and a 10V to 100V-applied photoelectron extracting electrode placed at a distance of 1 to 10 mm therefrom were mounted in a vacuum container.

When the photoelectric surface of the first prior art photocathode apparatus was subject to a 266 nm laser ray, a photocurrent of 1.5 nA was obtained. Since the number of photons of 1 mW of the 266 nm laser ray was $1.3\times10^{15}$/s and the number of electrons of 1.6 nA was $1\times10^{10}$/s, the quantum efficiency η was $$\eta=(1\times10^{10}\times1.5/1.6)/1.3\times10^{15}\approx10^{-5}$$

On the other hand, when the incident/reflective surface of the photocathode apparatus of FIG. 1 was subject to a 266 nm laser ray, a photocurrent of 1000 to 10000 nA was obtained. Therefore, the quantum efficiency η was $$\begin{aligned}\eta &= (1\times10^{10}\times(10^{3}\sim10^{4})/1.6)/1.3\times10^{15}\\ &= 5\times10^{-2}\sim5\times10^{-3}\end{aligned}$$

Thus, the quantum efficiency η of the photocathode apparatus of FIG. 1 was several hundreds times or several thousand times as compared with that of the first prior art photocathode apparatus.

The invention claimed is:

1. A photocathode apparatus, comprising:

a transparent body adapted to receive incident light; and a single metal cover layer formed on a first surface of said transparent body, wherein said metal cover layer includes an incident/reflective surface which receives said incident light through said first surface of said transparent body to excite surface plasmon resonance light in said incident/reflective surface of said metal cover layer, thus emitting photoelectrons from a photoelectric surface of said metal cover layer opposite to said incident/reflective surface thereof by a photoelectric effect of one of surface plasmon resonance photons and a second harmonic generation wave of said surface plasmon resonance photons, wherein said photocathode apparatus further comprises a layer including one of an alkali metal and an alkali metal compound formed directly on the photoelectric surface of said metal cover layer, wherein said layer including one of an alkali metal and an alkali metal compound decreases a work function of said metal cover layer.

2. The photocathode apparatus as set forth in claim 1, wherein an incident angle of said incident light to said metal cover layer is a light absorption dip angle by which a reflectivity of said incident light at said incident/reflective surface of said metal cover layer is minimum in a total reflection region.

3. The photocathode apparatus as set forth in claim 2, wherein a thickness of said metal cover layer is determined so that the reflectivity of said incident light at said incident/reflective surface of said metal cover layer is minimum when said incident light is incident at said light absorption dip angle to said incident/reflective surface of said metal cover layer.

4. The photocathode apparatus as set forth in claim 3, wherein a thickness of said layer formed on the photoelectric surface of said metal cover layer is less than 5 nm, so that the reflectivity of said incident light at said light absorption dip angle is minimum.

5. The photocathode apparatus as set forth in claim 4, wherein the thickness of said metal cover layer is compensated for by the thickness of said layer including one of an alkali metal and an alkali metal compound formed on the photoelectric surface of said metal cover layer.

6. The photocathode apparatus as set forth in claim 1, wherein said transparent body comprises a prism.

7. The photocathode apparatus as set forth in claim 6, wherein said first surface of said transparent body on which said metal cover layer is formed is a first surface of said prism, and said first surface of said prism opposes an arris of said prism.

8. The photocathode apparatus as set forth in claim 6, wherein said prism has second and third surfaces forming an arris thereof, and wherein said photocathode apparatus further comprises an anti-reflection coating layer formed on said second surface of said prism, said incident light being incident through said anti-reflection coating layer to said prism.

9. The photocathode apparatus as set forth in claim 8, further comprising a reflection coating layer formed on said third surface of said prism.

10. The photocathode apparatus as set forth in claim 1, further comprising a laser unit adapted to emit said incident light.

11. The photocathode apparatus as set forth in claim 10, further comprising a wavelength plate disposed between said laser unit and said transparent body.

12. The photocathode apparatus as set forth in claim 1, wherein:

said transparent body comprises a quartz glass prism, said metal cover layer comprises an aluminum layer, said incident light is ultraviolet light, and said photoelectrons are emitted by the photoelectric effect of said surface plasmon resonance photons.

13. The photocathode apparatus as set forth in claim 1, wherein said incident light has a pulse width of at least 10 femto seconds.

14. The photocathode apparatus as set forth in claim 1, wherein:

said transparent body comprises a common glass prism, said metal cover layer comprises a silver layer, said incident light is visible light, and said photoelectrons are emitted by the photoelectric effect of the second harmonic generation wave of said surface plasmon resonance photons.

15. The photocathode apparatus as set forth in claim 1, wherein a plurality of holes are perforated in said metal cover layer, a diameter of each of said holes being smaller than a wavelength of said incident light.

16. The photocathode apparatus as set forth in claim 15, wherein said holes are regularly arranged in said metal cover layer.

* * * * *